United States Patent
Oota et al.

(10) Patent No.: US 6,995,464 B2
(45) Date of Patent: Feb. 7, 2006

(54) PRESSURE-CONTACT TYPE SEMICONDUCTOR DEVICE

(75) Inventors: Kenji Oota, Tokyo (JP); Futoshi Tokunoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 9 days.

(21) Appl. No.: 10/765,158

(22) Filed: Jan. 28, 2004

(65) Prior Publication Data

US 2004/0183093 A1    Sep. 23, 2004

(30) Foreign Application Priority Data

Feb. 12, 2003   (JP)   ............................ 2003-033325

(51) Int. Cl.
*H01L 23/48* (2006.01)
(52) U.S. Cl. .................... 257/688; 257/659; 257/687; 257/785
(58) Field of Classification Search ............... 257/688, 257/785, 659, 687
See application file for complete search history.

(56) References Cited

FOREIGN PATENT DOCUMENTS

| EP | 0 746 021 | 12/1996 |
|----|-----------|---------|
| JP | 8-330572 | 12/1996 |

*Primary Examiner*—Long Pham
(74) *Attorney, Agent, or Firm*—Oblon, Spivak, McClelland, Maier & Neustadt, P.C.

(57) ABSTRACT

A gate electrode (1a) is formed on the outer peripheral step portion (1') of a semiconductor substrate (1) so as to face a pressure-contact supporting block (6), and a convex contacting portion (1g) is formed on a predetermined position on the surface of the gate electrode to contact the pressure contact supporting block. The surface area of the gate electrode ranging from the inner periphery to a position adjacent to the convex contacting portion, is coated with an insulation film (1d). The convex contacting portion (1g) is formed of a convex portion integral with the gate electrode or formed of another gate electrode (1a').

9 Claims, 5 Drawing Sheets

A部

PRESSURE-CONTACT TYPE SEMICONDUCTOR DEVICE

BACKGROUND OF THE INVENTION

1. Field of the Invention

The present invention generally relates to a pressure-contact type semiconductor device such as a Gate Commutated Turn-off (referred to as "GCT" hereinafter) thyristor, which is applied to, for example, a BTB, a SVG and the like for electric power applications, an inverter for driving an iron manufacturing roller and the like for industrial applications, and other high-voltage, large-capacity switches and the like.

2. Description of the Related Art

A conventional GCT thyristor will be described below with reference to FIG. 6. FIG. 6 is a cross-sectional view showing a main part of a GCT thyristor with a typical outer peripheral gate structure. Referring to the figure, an aluminum gate electrode 1a and an aluminum cathode electrode 1b are formed on an upper surface of a semiconductor substrate 1, and an aluminum anode electrode 1c is formed on a back surface thereof. Reference numeral 1d denotes an insulation film made of polyimide or the like, and reference numeral 1e denotes an insulating rubber member formed on the outermost periphery of the semiconductor substrate 1.

On the cathode electrode 1b on the top surface of the semiconductor substrate 1, a cathode distortion buffer plate 2 is provided, and an external cathode electrode (see FIGS. 1A and 1B) is formed on the outer top portion of the cathode distortion buffer plate 2. On the anode electrode 1c, an anode distortion buffer plate 4 is provided, and outside of it, an external anode electrode is formed under the anode distortion buffer plate 4. A ring gate portion 6 contacts the gate electrode 1a, and the contacting top end portion is a plane of about 0.5 mm width. An external gate terminal (see FIGS. 1A and 1B) electrically connects to the ring gate portion 6. The ring gate portion 6 is pressed to the gate electrode 1a by an annular elastic body having such a shape as a coned disc spring via an annular insulator, together with the external gate terminal. An insulator 10 insulates the ring gate portion 6 from the cathode distortion buffer plate 2 and the external cathode electrode. The GCT thyristor formed in this way has a sealed structure, the inside of which is substituted with an inert gas.

Next, an operation of the conventional GCT thyristor will be described. When the GCT thyristor is turned on, an electric current is flown from the external gate terminal to the external cathode electrode. A rising inclination of the gate current at this time is generally 1000 A/$\mu$s or more so as to speed up the turn-on expanding speed. When turned off, the current is flown from the external cathode electrode to the external gate terminal. At this time, it is required to supply a current with several thousands A/$\mu$s inclination for commutating the current equivalent to the main current to the gate. In order to supply such a large amount of current in an instant, a contact resistance of a current conducting path from the external gate terminal to the external cathode electrode is required to be reduced as much as possible.

Further, the GCT thyristor is generally used by applying a reverse bias voltage between the gate and the cathode. A gap between the cathode distortion buffer plate 2 and the gate electrode 1a formed on the surface of the semiconductor substrate has only several tens $\mu$m width. In order to prevent discharge in this gap, the insulation film 1d such as polyimide is formed on the innermost periphery and the surface of the gate electrode 1a to thereby coat the surface up to the position right below the insulator 10 (see, for example, Japanese Patent Unexamined Laid-open Publication No. 8-330572 (FIG. 1)).

However, in the conventional GCT thyristor as shown in FIG. 6, the ring gate portion 6 must contact the gate electrode 1a formed on the surface of the semiconductor substrate. Meanwhile, a portion of the gate electrode 1a positioned right below the outer periphery of the cathode distortion buffer plate 2, which is adjacent to the ring gate portion 6, must be coated with the polyimide insulation film 1d in order to prevent discharge.

Comparing to the aluminum electrodes and the polyimide insulation film formed by a photoengraving technique, the other fabrication members have larger dimensional tolerances. Further, in order to ensure a clearance for positioning each member at the time of fabricating, the positions of the cathode distortion buffer plate 2 and the ring gate portion 6 with respect to the semiconductor substrate 1 are varied within the range of the integration tolerance which is the sum of the dimensional tolerances of the respective members.

Moreover, the ring gate portion 6 and the outer peripheral portion of the cathode distortion buffer plate 2 adjacent thereto must be fabricated in an extremely narrow region of the outer peripheral portion of the semiconductor substrate. Therefore, it was extremely difficult to satisfy the condition that "a portion of the gate electrode 1a positioned right below the outer periphery of the cathode distortion buffer plate 2 must be coated with the polyimide insulation film 1d to prevent discharge in the gap", considering from aspects of the component processing accuracy and the positioning accuracy when fabricating.

As another measure for preventing the discharge in the conventional structure, there is a method to remove the gap itself by decreasing the diameter of the cathode distortion buffer plate 2 and retracting it up to the outer diameter equivalent to that of the cathode electrode 1d formed on the surface of the semiconductor substrate. In this case, however, there arises a problem that dynamic characteristics (for example, a serge resistance) of the GCT thyristor degrades.

SUMMARY OF THE INVENTION

The present invention is made to solve the aforementioned problems. An object of the present invention is to provide a pressure-contact type semiconductor device with a structure capable of easily preventing discharge with high accuracy in a gap between a cathode distortion buffer plate and a gate electrode without degrading dynamic characteristics.

In order to achieve the aforementioned object, according to the present invention, a pressure-contact type semiconductor device having an outer peripheral gate structure includes an external cathode electrode, an external anode electrode and an external gate terminal for flowing an electric current at a time of turn on/off operation, and the semiconductor device includes a semiconductor substrate having an outer peripheral step portion thinned in thickness thereof. The semiconductor substrate has a gate electrode and a cathode electrode formed on a top surface side of the substrate, and an anode electrode formed on a back surface of the substrate. The semiconductor device further includes a pressure-contact supporting block which is provided in an inner periphery of the external gate terminal and located on the gate electrode.

In this construction, the gate electrode is formed on the top surface of the outer peripheral step portion of the semiconductor substrate so as to face the pressure-contact supporting block, and a convex contacting portion is formed at a predetermined position of a top surface of the gate electrode so as to contact the pressure-contact supporting block, and an insulation film is formed on a surface area of the gate electrode, ranging from an inner periphery of the gate electrode to a position adjacent to the convex contacting portion.

With this configuration, a portion where a ring gate contacts the aluminum gate electrode can be positioned more accurately than that of the conventional structure shown in FIG. 6, so that the film formation area of the polyimide insulation film can be extended. Accordingly, the structure for preventing discharge in the gap between the cathode distortion buffer plate and the gate electrode formed on the semiconductor substrate can be achieved more accurately than the conventional device.

BRIEF DESCRIPTION OF THE DRAWINGS

These and other objects and features of the present invention will be readily understood from the following detailed description taken in conjunction with preferred embodiments thereof with reference to the accompanying drawings, in which.

DESCRIPTION OF THE PREFERRED EMBODIMENTS

Figure 1A:
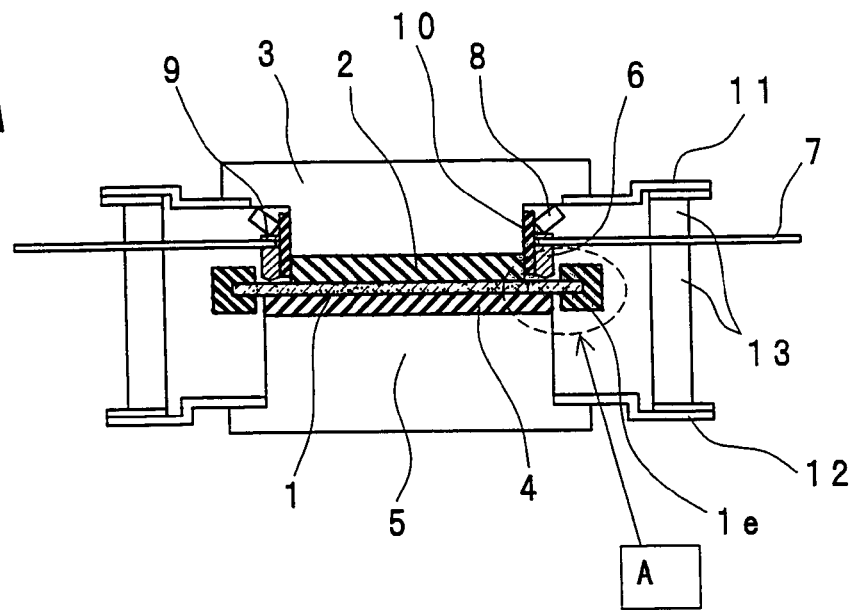
FIG. 1A is a schematic diagram showing a GCT thyristor according to a first embodiment of the present invention.

Hereinafter, preferred embodiments of the present invention will be described with reference to the accompanying drawings. In the descriptions, the embodiments of the present invention will be given of GCT thyristors shown in the figures. However, the present invention is not limited thereto, and is also applicable to other pressure-contact type semiconductor devices. Note that the same reference numerals are used for the common elements in each figure, and the repetition thereof will be omitted for brevity.

First Embodiment

Figure 1B:
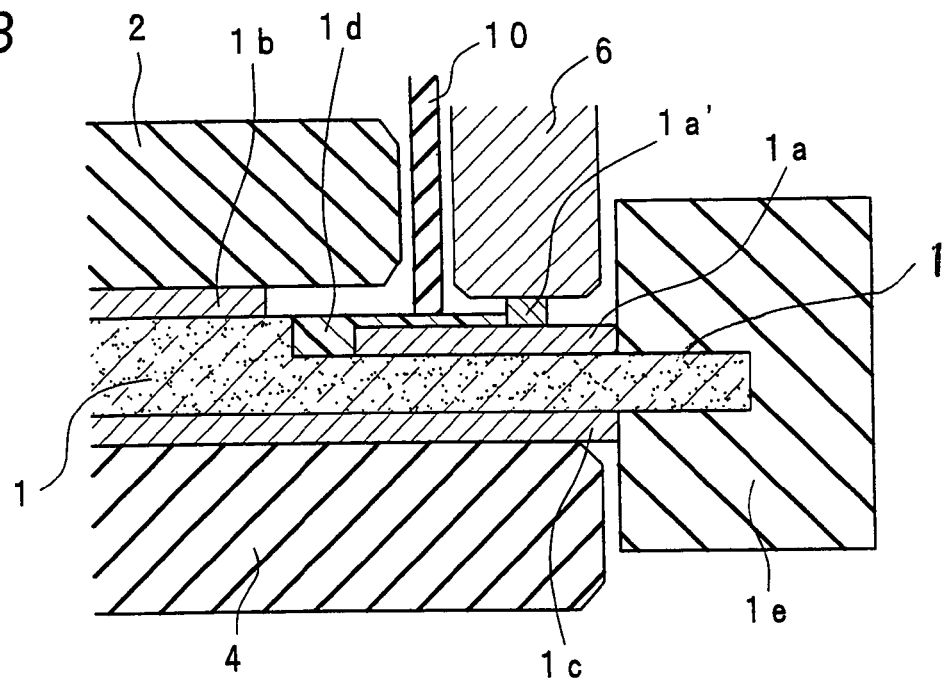
FIG. 1B is an enlarged cross-sectional view showing a main part of FIG. 1A.

Hereinafter, a first embodiment of the present invention will be described with reference to FIGS. 1A and 1B. FIG. 1A is a schematic diagram showing a GCT thyristor having an outer peripheral gate structure according to the first embodiment of the present invention, and FIG. 1B is an enlarged cross-sectional view showing a main part indicated as "A part" of the embodiment shown in FIG. 1A. In FIGS. 1A and 1B, reference numeral 1 denotes a semiconductor substrate, and a portion in the vicinity of the outer periphery thereof is formed as a thin step portion 1' where the thickness of the semiconductor substrate is thinned by a predetermined value. On the surface of the step portion 1', a first gate electrode 1a made of aluminum is formed, and a second gate electrode 1a' is convexly formed at a predetermined position on the surface of the first gate electrode 1a. Reference numeral 1b denotes a cathode electrode made of aluminum, 1c denotes an anode electrode made of aluminum, 1d denotes an insulation film made of polyimide or the like for preventing discharge in a gap, and 1e denotes an insulating rubber member holding an outermost peripheral end of the semiconductor substrate 1.

On the top surface of the step portion in the vicinity of the outer periphery of the semiconductor substrate, the polyimide insulation film 1d is formed so as to overlay an internal top surface portion of the first gate electrode 1a facing a cathode distortion buffer plate 2. The top surface level of the polyimide insulation film 1d is made coincident with the height level of the top surface of the semiconductor substrate 1.

It should be noted that, in this embodiment, the film thicknesses of the first gate electrode, the cathode electrode, the anode electrode and the polyimide insulation film are several tens $\mu$m order. However, the present invention is not limited to those film thickness. The cathode distortion buffer plate 2 is disposed on the surface of the cathode electrode 1b formed on the semiconductor substrate 1, and an external cathode electrode 3 is formed outside the cathode distortion buffer plate 2. An anode distortion buffer plate 4 is disposed on the surface of the anode electrode 1c, and an external anode electrode 5 is formed outside the anode distortion buffer plate 4 below the semiconductor substrate 1 in the figure. A ring gate portion 6 which serves as a pressure-contact supporting block is disposed on the second gate electrode 1a' so as to directly contact the top surface of the second gate electrode 1a'. An external gate terminal 7 is not fixed to, but is electrically connected to the ring gate portion 6. Reference numeral 8 denotes an annular elastic body having such a shape as a coned disc spring which presses the ring gate portion 6 together with the external gate terminal 7 to the second gate electrode 1a' via an annular insulator 9. In this way, the convex second gate electrode 1a' has a function of positioning a portion of the ring gate portion 6 to contact and abut the aluminum gate electrode.

An insulator body 10 is provided between the cathode distortion buffer plate 2 and the ring gate portion 6 so as to insulate the ring gate portion 6 from the cathode distortion buffer plate 2 and the external cathode electrode 3. The structure also includes a first flange 11 affixed to the outer peripheral end of the external cathode electrode 3, a second flange 12 affixed to the outer peripheral end of the external anode electrode 5, and an insulation cylinder 13 made of ceramic or the like which is held between the first and the second flanges. The GCT thyristor configured in this manner has a sealed structure, and the inside thereof is filled with an inert gas.

In the structure of the first embodiment, on the surface of the first gate electrode 1a, the second gate electrode 1a' is convexly formed by applying a photoengraving technique, so that the approximate center of the bottom surface of the ring gate electrode 6 accurately contacts the top surface of the convex second gate electrode 1a'. That is, the first gate electrode 1a is formed on the top surface of the outer peripheral step portion 1' of the semiconductor substrate so as to face the ring gate portion 6 provided as a pressure-contact supporting block. At the predetermined position of the top surface of the first gate electrode 1a, the second gate electrode 1a' is formed as a convex contacting portion to thereby contact the predetermined position of the ring gate portion 6 provided as a pressure-contact supporting block. An inner side portion and a top surface portion of the first gate electrode, ranging from the inner periphery to the position adjacent to the second gate electrode 1a' of a convex contacting portion, is coated with the polyimide insulation film 1d.

Figure 6:
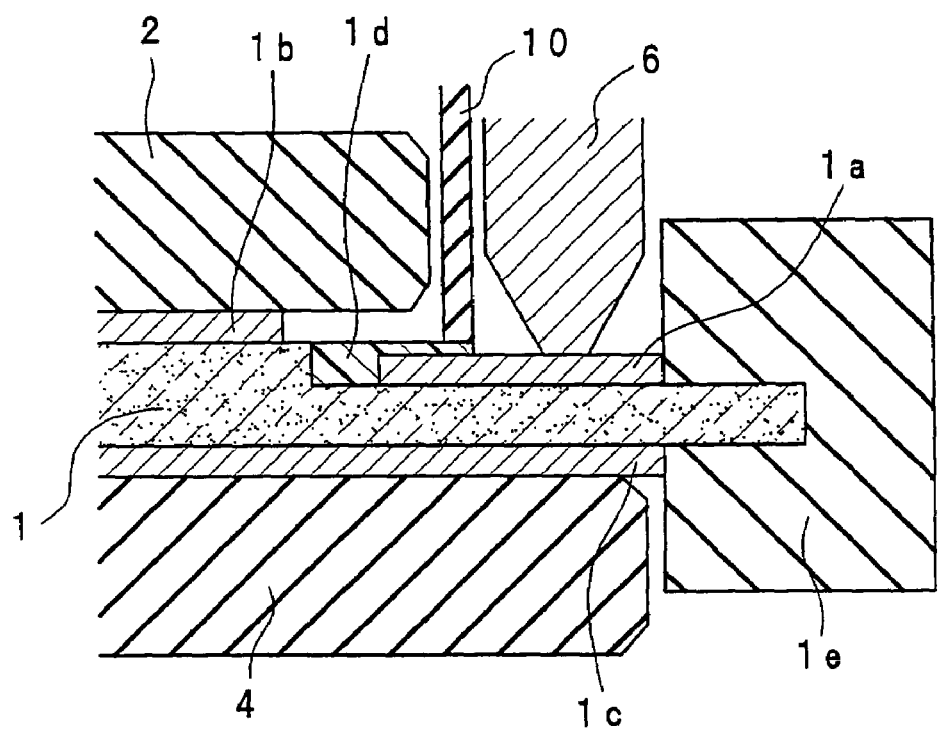
FIG. 6 is an enlarged cross-sectional view showing a main part of a conventional GCT thyristor.

With this configuration, the present embodiment can achieve more accurate positioning of the portion at which the ring gate portion 6 contacts the aluminum gate electrode, compared to that of the conventional configuration shown in FIG. 6. According to the effect in which the positioning can be performed more accurately than the conventional configuration, the film formation area of the polyimide insulation film 1d formed on the surface of the first gate electrode 1a can be extended outward up to the position adjacent to the second gate electrode 1a', from the position right below the insulator body 10.

Accordingly, it becomes possible to satisfy the condition that "the gate electrode 1a positioned right below the outer periphery of the cathode distortion buffer plate 2 must be coated with the polyimide 1d" in order to prevent discharge in the gap between the cathode distortion buffer plate 2 and the gate electrode 1a formed on the surface of the semiconductor substrate. Further, it becomes possible to achieve the positioning of the cathode distortion buffer plate 2 and the ring gate portion 6 with respect to the semiconductor substrate 1 more accurately than the conventional structure.

Preferably, in the case where the second gate electrode 1a' is formed by evaporating a metal such as nickel (Ni) which is little oxidative, it is possible to suppress oxidation during the manufacturing process, to thereby reduce the contact resistance against the ring gate portion 6. Moreover, if the second gate electrode 1a' is made of a metallic material such as gold (Au) which is less oxidative than nickel (Ni), oxidation during the manufacturing process can be further suppressed. Since gold (Au) and aluminum (Al) are not easily adhered to each other, the second gate electrode 1a' may be formed on the first gate electrode 1a, to have a multilayer structure with nickel (Ni) and gold (Au) laminated in turn in this order. With this structure, oxidation of the second gate electrode 1a' during the manufacturing process can be further suppressed and adherence performance of the second gate electrode 1a' to the first gate electrode 1a is improved, so that the contact resistance between the second gate electrode 1a' and the ring gate portion 6 may be further reduced.

Second Embodiment

Figure 2:
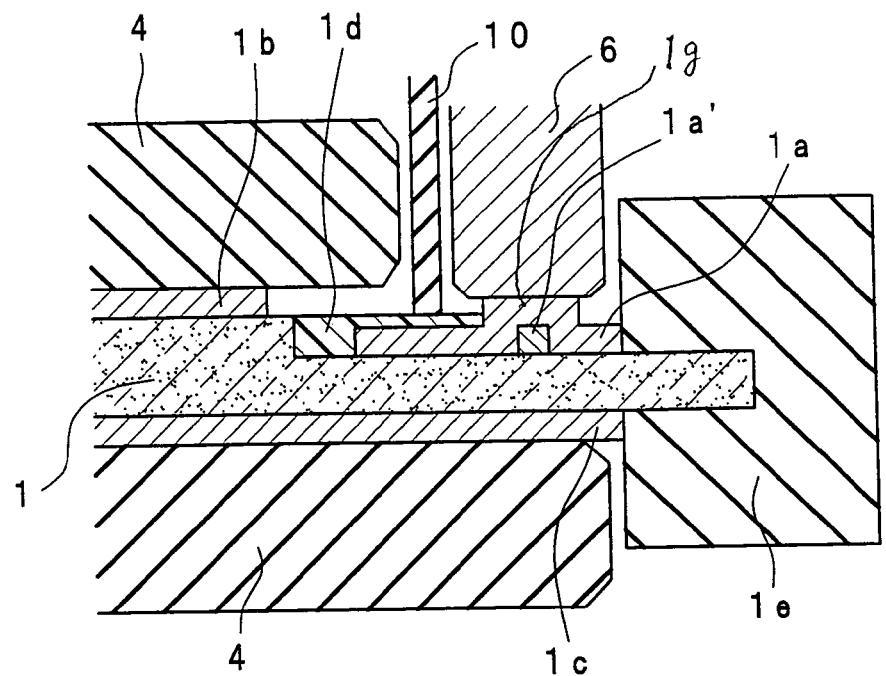
FIG. 2 is an enlarged cross-sectional view showing a main part of a GCT thyristor according to a second embodiment of the present invention.

Hereinafter, a second embodiment of the present invention will be described with reference to FIG. 2. FIG. 2 is an enlarged cross-sectional view showing a main part indicated as "A part" of the GCT thyristor having an outer peripheral gate structure according to the second embodiment of the present invention. In the second embodiment as shown in FIG. 2, the second gate electrode 1a' is disposed on the surface of the thin step portion 1' of the semiconductor substrate 1, and the first gate electrode 1a is formed on the surface of the semiconductor substrate 1 so as to overlay the second gate electrode 1a'. In this configuration, a part of the first gate electrode 1a overlying the second gate electrode 1a' is convexly formed.

More specifically, the second gate electrode 1a' is formed on the outer peripheral step portion 1' of the semiconductor substrate 1 so as to face the pressure-contact supporting block 6, and the first gate electrode 1a is formed to entirely overlay the second gate electrode 1a' The first gate electrode 1a has a convex portion 1g integrally protruded therefrom so that the top surface of the convex portion 1g abuts the bottom surface of the pressure-contact supporting block 6.

With this configuration of the present embodiment, it becomes possible to more accurately position the contacting portion of the ring gate portion 6 to abut the aluminum gate electrode, compared to that of the conventional configuration shown in FIG. 6. Accordingly, the film formation area of the polyimide insulation film 1d formed on the surface of the first gate electrode 1a can be extended outward up to the position adjacent to the convex portion of the first gate electrode 1a.

Thus, by forming a convex portion integrally protruded from the first gate electrode, the same effect as the first embodiment can be achieved in preventing discharge in the gap between the cathode distortion buffer plate 2 and the gate electrode 1a formed on the surface of the semiconductor substrate. Moreover, in the first embodiment, the second gate electrode 1a' is exposed to the surface of the gate electrode as a fine protrusion. In the second embodiment, in contrast, the second gate electrode 1a' is covered and protected by the first gate electrode 1a. Therefore, this configuration can reduce damages caused by the mechanical stress at the time of pressure contact by the ring gate portion 6, which improves the reliability of the GCT thyristor.

Third Embodiment

Figure 3:
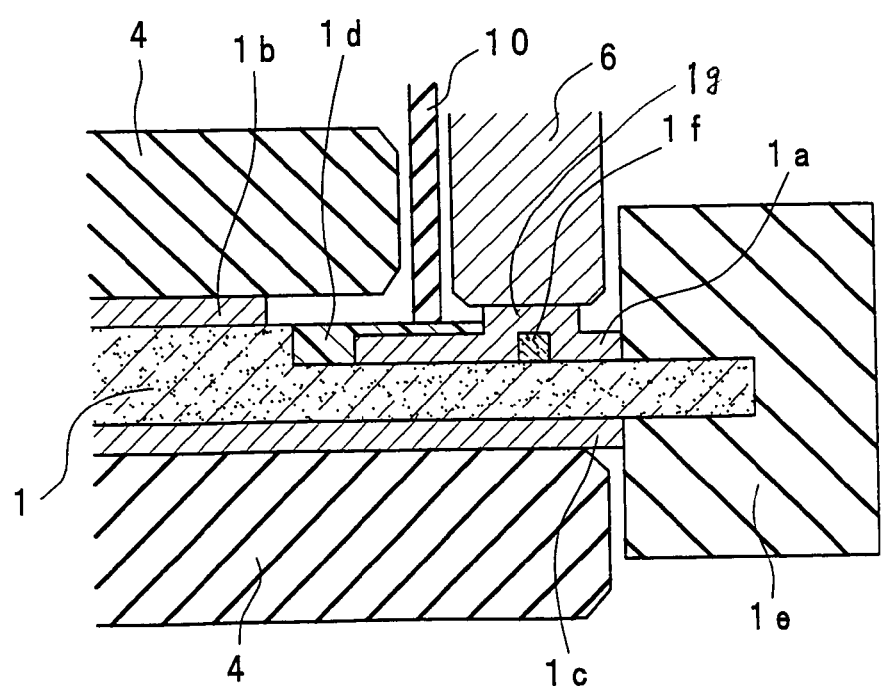
FIG. 3 is an enlarged cross-sectional view showing a main part of a GCT thyristor according to a third embodiment of the present invention.

Hereinafter, a third embodiment of the present invention will be described with reference to FIG. 3. FIG. 3 is an enlarged cross-sectional view showing a main part indicated as "A part" of the GCT thyristor having an outer peripheral gate structure according to the third embodiment of the present invention. In the third embodiment as shown in FIG. 3, a portion of the surface of the semiconductor substrate 1 is chemically etched so as to form a protrusion 1f, and subsequently the first gate electrode 1a is formed so as to entirely overlay the protrusion 1f. The other parts of the structure are the same as those of the second embodiment. In this fabrication, the protrusion 1f is formed by performing the etching at least two times.

In the first etching process, in order to align the height of the protrusion 1f to be a prescribed height, an area of the semiconductor substrate 1 for forming the first gate electrode 1a thereon is etched from the surface. Next, a protection film (not shown) for maintaining a non-etched portion is formed on a position of the surface of the etched substrate which is to be left as the top surface of the protrusion 1f. In the condition having the protection film formed, the second etching is performed so that the non-etched portion remains as the protrusion 1f formed on the corresponding portion of the surface of the step portion 1' which is formed by etching the outer peripheral portion of the semiconductor substrate 1. Subsequently, the first gate electrode 1a is formed on surface of the step portion 1' of the semiconductor substrate 1 so as to overlay the protrusion 1f.

More specifically, the first gate electrode 1a contains the protrusion 1f which is integrally formed with the semiconductor substrate and is protruded on the outer peripheral step portion 1' of the semiconductor substrate 1. In this configuration, a convex portion 1g is integrally formed with the first gate electrode 1a to overlay the protrusion 1f, so that the top surface of the convex portion 1g abuts the bottom of the ring gate portion 6.

With this configuration, it becomes possible to more accurately position the contacting portion of the ring gate portion 6 to contact the aluminum gate electrode, compared to that of the conventional configuration shown in FIG. 6. Accordingly, the film formation area of the polyimide insulation film 1d formed on the surface of the first gate electrode 1a can be extended outward up to the position adjacent to the convex portion 1g of the first gate electrode 1a.

Thus, by forming a portion of the semiconductor substrate 1 to be a protrusion (1f) and a portion of the first gate electrode 1a overlaying the protrusion 1f to be a convex portion (1g), the same effect as that of the first and the second embodiments can be achieved in preventing discharge in the gap between the cathode distortion buffer plate 2 and the first gate electrode 1a. Moreover, in the first and the second embodiments, the second gate electrode 1a' is formed as a convex portion through vapor-depositing a metal such as aluminum (Al). However, if adherence of the electrodes are not well performed, there is a possibility that the second gate electrode is peeled off from the semiconductor substrate.

In the third embodiment, the protrusion if is integrally formed with the semiconductor substrate 1 by partially etching the substrate as described above, instead of using the second gate electrode 1a'. Accordingly, the third embodiment can surely avoid the problem of peel-off of the gate electrode, to thereby further improve the reliability of the GCT thyristor than that of the second embodiment.

Fourth Embodiment

Figure 4A:
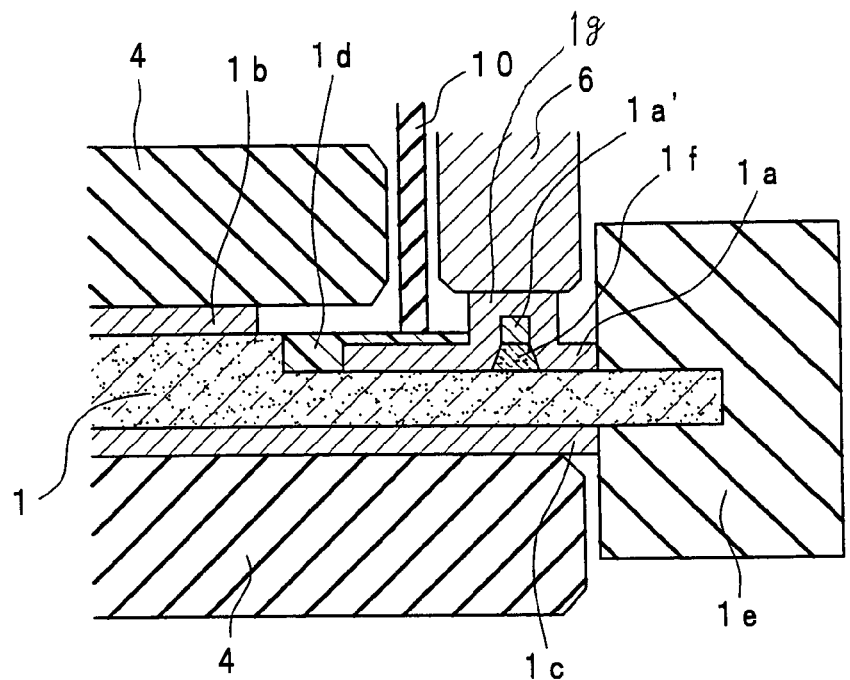
FIG. 4A is an enlarged cross-sectional view showing a main part of a GCT thyristor according to a fourth embodiment of the present invention.
Figure 4B:
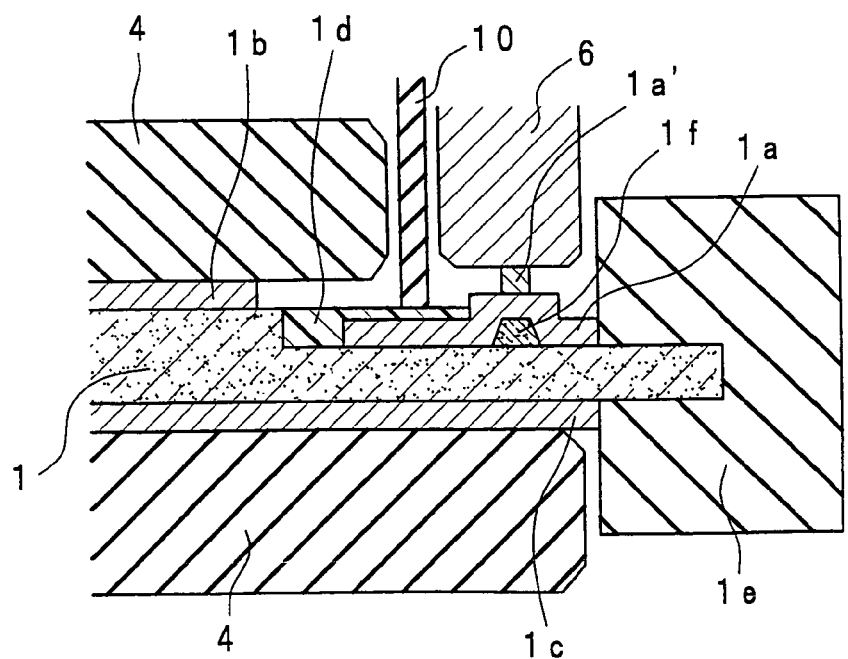
FIG. 4B is an enlarged cross-sectional view showing the main part of its modification.

Hereinafter, a fourth embodiment of the present invention will be described with reference to FIGS. 4A and 4B. FIG. 4A is an enlarged cross-sectional view showing a main part (indicated as "A part") of the GCT thyristor having an outer peripheral gate structure according to the fourth embodiment of the present invention, and FIG. 4B is a view showing a modification thereof. In the fourth embodiment as shown in FIG. 4A, the semiconductor substrate 1 is chemically etched so as to form the protrusion if as same as the third embodiment, and the second gate electrode 1a' is disposed on the surface of the protrusion 1f, and the first gate electrode 1a is formed on the surface of the semiconductor substrate 1 so as to overlay the protrusion if and the second gate electrode 1a'.

In this way, the second gate electrode 1a' is formed after the protrusion 1f is formed, then the first gate electrode 1a is formed to protect them. In this configuration, the first gate electrode 1a has a partially convex portion 1g the top surface of which contacts the bottom surface of the ring gate portion 6. That is, the first gate electrode contains the protrusion if which is integrally formed on the outer peripheral step portion 1' of the semiconductor substrate, and the convex portion 1g of the first gate electrode 1a is formed to cover the protrusion 1f.

With this configuration, it becomes possible to more accurately position the contacting portion of the ring gate portion 6 to contact the aluminum gate electrode, compared to the conventional configuration shown in FIG. 6. According to the improvement of the accuracy in positioning, the film formation area of the polyimide insulation film id formed on the surface of the first gate electrode 1a can be extended outward up to the position adjacent to the convex portion 1g of the first gate electrode 1a.

With the configuration, since the second gate electrode 1a' disposed on the surface of the protrusion 1f of the semiconductor substrate 1 is covered and protected by the first gate electrode 1a, even when the convex portion 1g of the first gate electrode 1a contacting the bottom end of the ring gate portion 6 is suffered from damages such as breakage caused by friction with the ring gate portion 6, the second gate electrode 1a' functions as a protective member, to thereby further improve the reliability of the GCT thyristor than that of the third embodiment.

Further, it is preferable that the protrusion 1f of the semiconductor substrate 1 formed by etching have a taper shape, that is, trapezoid in cross-section. This is because the protrusion 1f is a fine protrusion and may be chipped or broken when any mechanical damage or the like is applied after the protrusion 1f is formed. By forming the protrusion 1f to be tapered having a trapezoid shape in cross-section, the bottom of the protrusion if can be made larger so that breakage can be effectively prevented.

It should be noted here that in the present embodiment, the formation order of the first and the second gate electrodes la and 1a' may be changed. In the modification shown in FIG. 4B, the protrusion if is first formed by etching the surface of the semiconductor substrate 1. Then, the first gate electrode 1a is formed so as to overlay the protrusion 1f in the same manner as in the third embodiment. Subsequently, the second gate electrode 1a' is formed on the top surface of the convex portion of the first gate electrode 1a above the forming position of the protrusion 1f. Thus, it may be configured that the top surface of the second gate electrode 1a' contacts the bottom end surface of the ring gate portion 6 in the same manner as in the first embodiment. That is, the first gate electrode la contains the protrusion 1f integral with the semiconductor substrate is formed on the outer peripheral step portion thereof, and the second gate electrode 1a' is formed as the convex contacting portion (1g) contacting the bottom of the ring gate portion 6.

With this configuration, the second gate electrode 1a' formed as a fine convex portion may be subject to breakage and abrasion because of direct contact with the bottom surface of the ring gate portion 6. However, even when the second gate electrode 1a' is broken, the first gate electrode 1a functions as a protective member, so that the reliability of the GCT thyristor is further improved than that of the third embodiment.

Fifth Embodiment

Figure 5A:
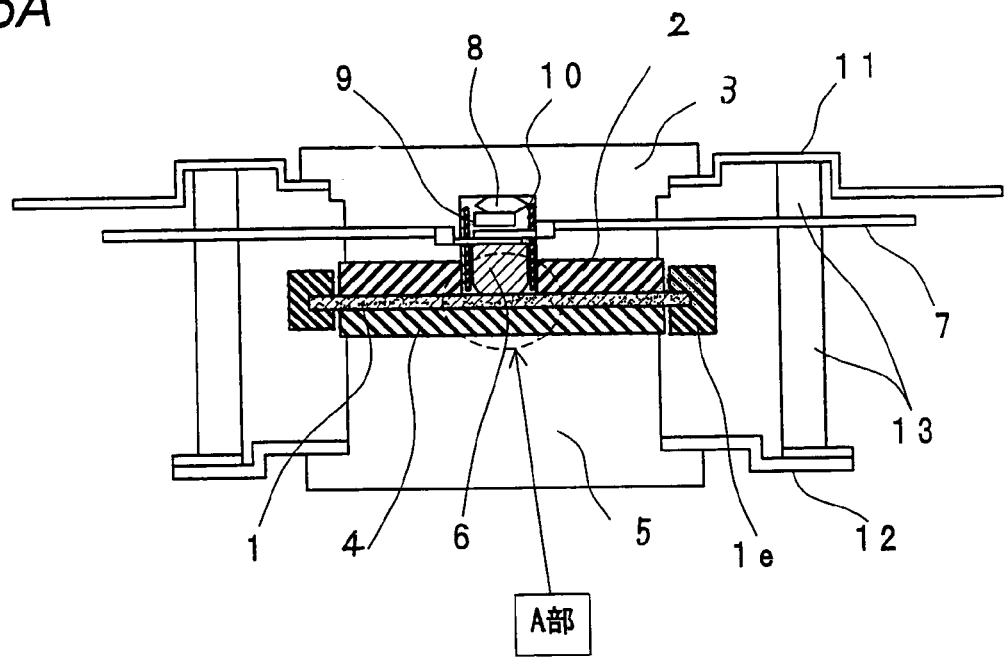
FIG. 5A is a schematic diagram showing a GCT thyristor according to a fifth embodiment of the present invention.

Hereinafter, a fifth embodiment of the present invention will be described with reference to FIGS. 5A and 5B. FIG. 5A is a schematic diagram showing a GCT thyristor having a center gate structure according to the fifth embodiment of the present invention, and FIG. 5B is an enlarged cross-sectional view showing a main part indicated as "A part" in FIG. 5A.

Figure 5B:
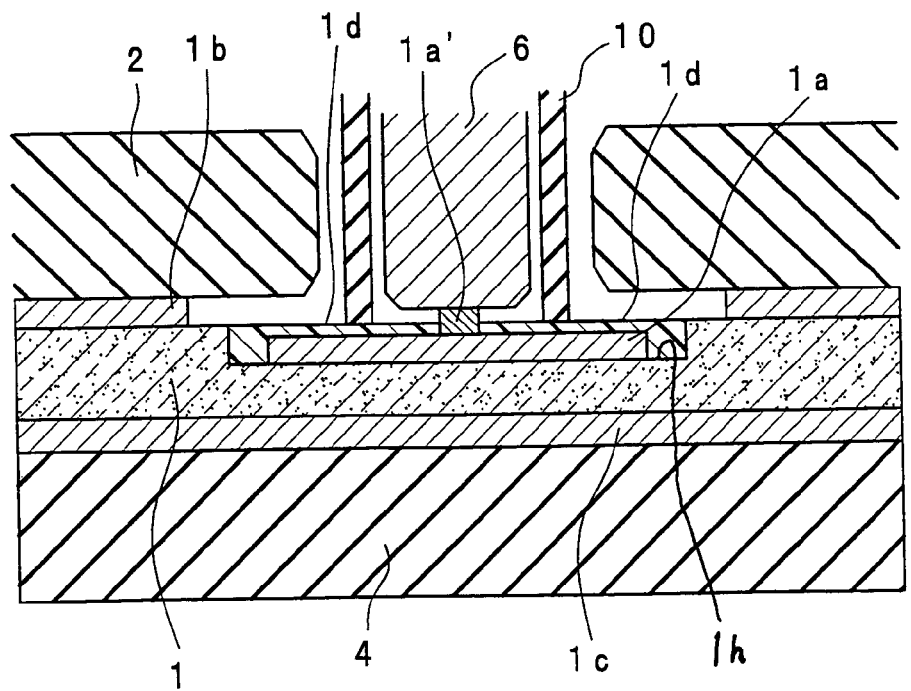
FIG. 5B is an enlarged cross-sectional view showing a main part of FIG. 5A.

In contrast to the first to the fourth embodiments each having an outer gate structure in which the ring gate portion 6 is provided on the outer periphery of the semiconductor substrate 1, in the fifth embodiment as shown in FIGS. 5A and 5B, the ring gate portion 6 is provided at a center part of the semiconductor substrate 1 which is referred to as "a center gate structure" in the description.

More specifically, in the fifth embodiment, a concave step portion 1h is formed in the center part of the surface of the semiconductor substrate 1 by etching. Then, the first gate electrode 1a is disposed on the concave step portion 1h, and the second gate electrode 1a' is disposed at a center part of the top surface of the first gate electrode 1a, so that the second gate electrode 1a' which serves as the convex contacting portion contacts the center part of the bottom surface of the ring gate portion 6.

That is, in the fifth embodiment, the ring gate portion 6 serving as the pressure contact supporting block 6 is provided on the convex contacting portion 1a' disposed in the center part of the semiconductor substrate 1 and between a pair of the insulator bodies 10 in the inner periphery of the outer gate terminal 7. The first gate electrode 1a is disposed in the concave step portion 1h formed at the center part of the semiconductor substrate so as to face the pressure contact supporting block 6. At the center part of the top surface of the first gate electrode 1a, the second gate electrode 1a' is formed as the convex contacting portion 1g which contacts the bottom of the ring gate portion 6.

It is noted here that, instead of forming the second gate electrode 1a', the convex contacting portion 1g may be formed of a convex portion integral with the first gate electrode 1a as shown in FIGS. 2, 3 and 4A, so that the convex portion of the first gate electrode 1a contacts the pressure contact supporting block 6.

Referring back to FIG. 5B, the top surface of the first gate electrode except the area of forming the convex contacting portion 1a' (or 1g) is coated with the polyimide insulation film 1d.

In this example, the top surface of the first gate electrode other than the second gate electrode 1a' is coated with the polyimide insulation film 1d, and the film formation area of the polyimide insulation film 1d is expanded up to the position adjacent to the convex second gate electrode 1a'. In this way, it is also possible to achieve the same effects as those of the first to the fourth embodiments, even with the center gate structure in which the ring gate portion 6 is provided at the center part of the semiconductor substrate 1.

For example, in the GCT thyristor according to the fifth embodiment of the present invention shown in FIGS. 5A and 5B, the outer peripheral gate structure of the GCT thyristor of the first embodiment shown in FIGS. 1A and 1B is changed to the center gate structure. Similarly, the outer peripheral gate structures of the GCT thyristors according to the second to the fourth embodiments shown in FIGS. 2 to 4A and 4B may be changed to the center gate structure. Further, it is noted that the outer peripheral gate structures of the GCT thyristors according to the first to the fourth embodiments or the center gate structure according to the fifth embodiment may be changed to a middle gate structure in which the ring gate portion 6 is provided at a middle part of the semiconductor substrate 1.

As described above, according to the present invention, it becomes possible to position a contacting portion of the ring gate portion to contact the aluminum gate electrode more accurately than the conventional device. According to the improvement of the positioning accuracy, the film formation region of the polyimide insulation film can be expanded. Therefore, the present invention can satisfy, more easily and accurately than the conventional device, the condition that "the gate electrode 1a positioned right below the outer periphery of the cathode distortion buffer plate 2 must be coated with the polyimide insulation film 1d so as to prevent the discharge in the gap", thereby improving the reliability of the GCT thyristor.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A pressure-contact type semiconductor device having an outer peripheral gate structure which includes an external cathode electrode, an external anode electrode and an external gate terminal for flowing an electric current at a time of turn on/off operation, said semiconductor device comprising:

a semiconductor substrate having an outer peripheral step portion thinned in thickness thereof, said semiconductor substrate having a gate electrode and a cathode electrode formed on a top surface side of the substrate, and an anode electrode formed on a back surface of the substrate; and a pressure-contact supporting block which is provided in an inner periphery of the external gate terminal and located on the gate electrode, wherein the gate electrode is formed on the top surface of the outer peripheral step portion of the semiconductor substrate so as to face the pressure-contact supporting block, wherein a convex contacting portion is formed at a predetermined position of a top surface of the gate electrode so as to contact the pressure-contact supporting block, and wherein an insulation film is formed on a surface area of the gate electrode, ranging from an inner periphery of the gate electrode to a position adjacent to the convex contacting portion.

2. The pressure-contact type semiconductor device according to claim 1, wherein said gate electrode is comprised of a first gate electrode and a second gate electrode, the first gate electrode is formed on the outer peripheral step portion of the semiconductor substrate so as to face the pressure-contact supporting block, the second gate electrode is formed as the convex contacting portion contacting the pressure-contact supporting block.

3. The pressure-contact type semiconductor device according to claim 1, wherein said convex contacting portion provided on the surface of the gate electrode is integrally formed with the gate electrode.

4. The pressure-contact type semiconductor device according to claim 1, wherein said gate electrode is comprised of a first gate electrode and a second gate electrode, the second gate electrode is formed on the surface of the outer peripheral step portion of the semiconductor substrate so as to face the pressure-contact supporting block, and the first gate electrode is formed so as to overlay the second gate electrode, and the convex contacting portion contacting the pressure-contact supporting block is integrally formed with the first gate electrode.

5. The pressure-contact type semiconductor device according to claim 3, wherein the gate electrode covers a protrusion which is integrally protruded from the surface portion of the outer peripheral step portion of the semiconductor substrate, and the convex contacting portion integrally formed with the gate electrode is formed to overlay the protrusion.

6. The pressure-contact type semiconductor device according to claim 1, wherein said gate electrode is comprised of a first gate electrode and a second gate electrode, the first gate electrode overlays a protrusion which is integrally protruded from the surface portion of the outer peripheral step portion of the semiconductor substrate, and the second gate electrode is formed on the first gate electrode so as to serve as the convex contacting portion.

7. The pressure-contact type semiconductor device according to claim 5, wherein a cross-section of the protrusion integrally formed on the semiconductor substrate has a taper shape which becomes narrower to the top thereof.

8. The pressure-contact type semiconductor device according to claim 2, wherein the second gate electrode is made of an electrode material which is less oxidative than at least an aluminum material.

9. The pressure-contact type semiconductor device according to claim 2, wherein the second gate electrode has a multilayer structure made of different types of materials.

* * * * *